US010048587B2

(12) United States Patent
Carcasi et al.

(10) Patent No.: US 10,048,587 B2
(45) Date of Patent: Aug. 14, 2018

(54) METHOD AND APPARATUS FOR INCREASED RECIRCULATION AND FILTRATION IN A PHOTORESIST DISPENSE SYSTEM USING A LIQUID EMPTY RESERVOIR

(71) Applicant: Tokyo Electron Limited, Tokyo (JP)

(72) Inventors: Michael Andrew Carcasi, Austin, TX (US); Wallace Paul Printz, Austin, TX (US); Joshua Steven Hooge, Austin, TX (US)

(73) Assignee: TOKYO ELECTRON LIMITED, Minato-Ku, Tokyo (JP)

( * ) Notice: Subject to any disclaimer, the term of this patent is extended or adjusted under 35 U.S.C. 154(b) by 113 days.

(21) Appl. No.: 14/713,997

(22) Filed: May 15, 2015

(65) Prior Publication Data
US 2015/0328650 A1 Nov. 19, 2015

Related U.S. Application Data

(60) Provisional application No. 61/993,856, filed on May 15, 2014.

(51) Int. Cl.
B05C 11/10 (2006.01)
G03F 7/16 (2006.01)
(Continued)

(52) U.S. Cl.
CPC .............. G03F 7/16 (2013.01); B05B 7/26 (2013.01); B05B 12/006 (2013.01);
(Continued)

(58) Field of Classification Search
USPC ... 118/52, 612, 319, 320, 56, 683, 684, 692; 427/240; 396/611, 627, 604; 134/153,
(Continued)

(56) References Cited

U.S. PATENT DOCUMENTS 3,423,357 A 1/1969 Suh
5,134,962 A 8/1992 Amada et al.
(Continued)

FOREIGN PATENT DOCUMENTS

JP H06-267837 9/1994
JP H10-242045 9/1998
(Continued)

OTHER PUBLICATIONS

Taiwanese Office Action issued in TW 104115350 dated Apr. 25, 2016 with English Language Translation.
(Continued)

Primary Examiner — Yewebdar T Tadesse
(74) Attorney, Agent, or Firm — DLA Piper LLP US

(57) ABSTRACT

An apparatus for dispensing a liquid onto a substrate may comprise a reservoir for storing the liquid to be dispensed; a filter comprising an inlet and an outlet, the filter inlet in fluidic communication with the reservoir via a first valve; a dosing pump comprising an inlet, a first outlet, and a second outlet, the dosing pump inlet in fluidic communication with the reservoir and the dosing pump second outlet in fluidic communication with the filter inlet via a second valve, the dosing pump configured to dose an amount of the liquid and pump the liquid; and a dispense nozzle in fluidic communication with the dosing pump first outlet, the dispense nozzle configured to dispense the liquid onto the substrate.

6 Claims, 19 Drawing Sheets

(51) Int. Cl.
*B05B 7/26* (2006.01)
*B05B 12/00* (2018.01)
*H01L 21/027* (2006.01)

(52) U.S. Cl.
CPC .......... *B05C 11/1013* (2013.01); *G03F 7/162* (2013.01); *H01L 21/0274* (2013.01)

(58) Field of Classification Search
USPC ................................................ 134/198, 902
See application file for complete search history.

(56) References Cited

U.S. PATENT DOCUMENTS

| | | | |
|---|---|---|---|
| 5,262,068 A | 11/1993 | Bowers et al. | |
| 5,490,765 A | 2/1996 | Bailey et al. | |
| 5,527,161 A | 6/1996 | Bailey et al. | |
| 5,778,911 A | 7/1998 | Yoshio | |
| 5,878,918 A | 3/1999 | Liao et al. | |
| 6,062,442 A | 5/2000 | Yang et al. | |
| 6,238,109 B1* | 5/2001 | Minami | G03D 5/00 118/52 |
| 6,348,098 B1 | 2/2002 | McLoughlin et al. | |
| 6,376,013 B1 | 4/2002 | Rangarajan et al. | |
| 6,500,242 B2 | 12/2002 | Fu et al. | |
| 7,654,414 B2 | 2/2010 | Hiranaga et al. | |
| 7,708,880 B2 | 5/2010 | Yajima | |
| 7,867,559 B2 | 1/2011 | Taniguchi et al. | |
| 8,728,330 B2 | 5/2014 | Takeishi | |
| 9,162,163 B2 | 10/2015 | Yoshida et al. | |
| 9,508,574 B2 | 11/2016 | Marumoto et al. | |
| 2001/0016427 A1 | 8/2001 | Ueda | |
| 2001/0050096 A1* | 12/2001 | Costantini | B01J 3/008 134/58 R |
| 2002/0000193 A1 | 1/2002 | Kitano et al. | |
| 2002/0048213 A1 | 4/2002 | Wilmer et al. | |
| 2002/0124798 A1* | 9/2002 | Kitano | G03F 7/16 118/300 |
| 2003/0170379 A1 | 9/2003 | Tsujii et al. | |
| 2003/0180471 A1* | 9/2003 | Takekuma | H01L 21/67253 430/271.1 |
| 2005/0048208 A1 | 3/2005 | Kao et al. | |
| 2006/0102282 A1 | 5/2006 | Scott | |
| 2006/0108701 A1 | 5/2006 | Saikin | |
| 2006/0252044 A1 | 11/2006 | Okumura et al. | |
| 2006/0285429 A1 | 12/2006 | Kamimura et al. | |
| 2007/0267065 A1 | 11/2007 | Okumura | |
| 2008/0087615 A1 | 4/2008 | Taniguchi et al. | |
| 2008/0169230 A1 | 7/2008 | Nakagawa | |
| 2008/0230492 A1 | 9/2008 | Kao et al. | |
| 2008/0251148 A1 | 10/2008 | Thie et al. | |
| 2010/0055294 A1 | 3/2010 | Wang et al. | |
| 2012/0241469 A1 | 9/2012 | Takeishi | |
| 2013/0002772 A1 | 1/2013 | Hiratsuka et al. | |
| 2013/0068324 A1 | 3/2013 | Furusho et al. | |
| 2013/0078381 A1* | 3/2013 | Miyagi | H01L 21/67051 427/345 |
| 2013/0280425 A1 | 10/2013 | Yoshida et al. | |
| 2014/0174475 A1 | 6/2014 | Takayanagi et al. | |
| 2015/0125793 A1* | 5/2015 | Yoshihara | G03F 7/16 430/270.1 |

FOREIGN PATENT DOCUMENTS

| | | |
|---|---|---|
| JP | 2001-066784 | 3/2001 |
| JP | 2001-340800 | 12/2001 |
| JP | 2004-305925 | 11/2004 |
| JP | 2007-103895 | 4/2007 |
| JP | 5409957 | 2/2014 |
| KR | 10-2007-0086631 | 8/2007 |
| WO | WO 2006/057345 | 6/2008 |

OTHER PUBLICATIONS

International Search Report and Written Opinion of the International Searching Authority issued in PCT/US2015/030798 dated Jul. 31, 2015.
English Language Translation and Abstract for JP 5409957 dated Feb. 5, 2014.
Japanese Office Action issued in JP 2016-567678 dated Aug. 29, 2017.
Korean Office Action issued in KR 10-2016-7035033 dated Nov. 13, 2017.
Japanese Office Action issued in JP 2016-567678 dated Mar. 6, 2018.
U.S. Appl. No. 14/713,987.
U.S. Appl. No. 14/713,992.

* cited by examiner

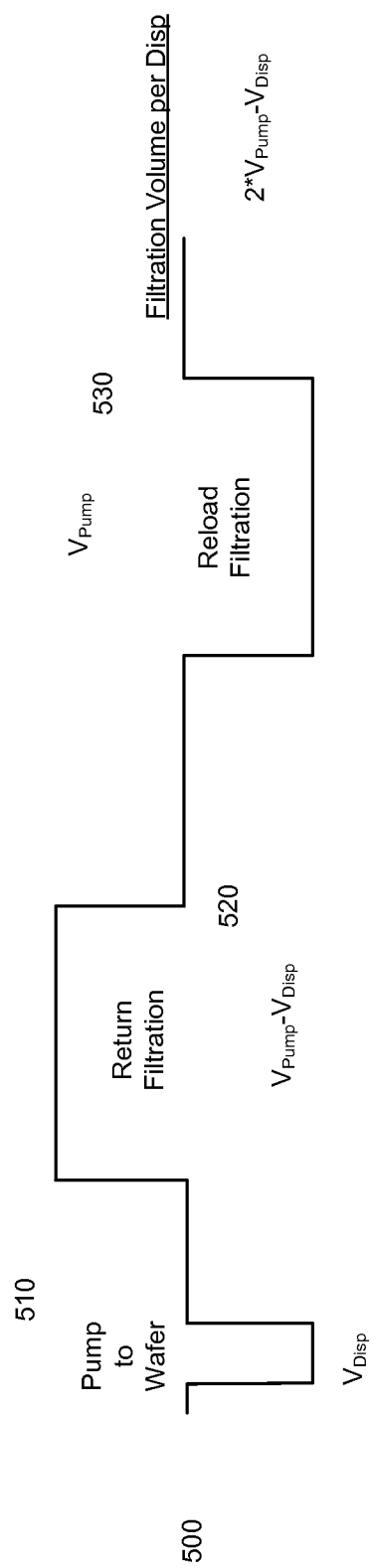
FIG. 5A – PRIOR ART

METHOD AND APPARATUS FOR INCREASED RECIRCULATION AND FILTRATION IN A PHOTORESIST DISPENSE SYSTEM USING A LIQUID EMPTY RESERVOIR

CROSS-REFERENCE TO RELATED APPLICATION

This disclosure claims priority from U.S. Provisional Application No. 61/993,856, entitled "Apparatus for Increased Recirculation and Filtration in a Photoresist Dispense System" and filed May 15, 2014, the entirety of which is incorporated by reference herein.

BACKGROUND

In a photolithographic technique for manufacturing semiconductor devices, a photoresist liquid is applied to a semiconductor wafer or a substrate to form a resist film exposed in accordance with a predetermined circuit pattern, and the exposed pattern is developed so that a circuit pattern is formed in the resist film. There is a possibility that bubbles of nitrogen gas or particles (foreign matter) might come to be mixed in a process liquid such as a photoresist liquid. When a process liquid containing bubbles or particles is supplied to a wafer, application non-uniformity and/or defect may occur. Thus, a liquid processing apparatus for supplying a process liquid to a wafer is provided with a filter for filtering bubbles and particles mixed in a process liquid.

Some processing apparatuses include a liquid supply system of a circulation filtration type. Such liquid supply systems may include a first container configured to store a process liquid; a second container configured to store a process liquid; a first pump disposed in a first pipe connecting the first container and the second container and configured to send the process liquid stored in the first container to the second container; a first filter disposed in the first pipe; a second pipe connecting the first container and the second container; and a second pump disposed in the second pipe and configured to send the process liquid stored in the second container to the first container. Some of these liquid supply systems may include a buffer container of a process liquid; a circulation and filtration apparatus that sucks a part of the process liquid from the buffer container to filter it using a filter, and then returns the filtered process liquid to the buffer container; and a pipe through which the process liquid is sent from the buffer container or the circulation apparatus to a photoresist application apparatus.

SUMMARY OF THE DISCLOSURE

A coating and developing apparatus may be used for coating a wafer with a photoresist liquid and subsequently developing the wafer. Systems and methods described herein may lower photoresist printed wafer defects.

An example apparatus for dispensing a liquid onto a substrate may comprise a reservoir for storing the liquid to be dispensed; a filter comprising an inlet and an outlet, the filter inlet in fluidic communication with the reservoir; a dosing pump comprising an inlet and an outlet, the dosing pump inlet in fluidic communication with the reservoir, the dosing pump configured to dose an amount of the liquid and pump the liquid; a dispense nozzle in fluidic communication with the dosing pump outlet, the dispense nozzle configured to dispense the liquid onto the substrate; and a recirculation pump comprising an inlet and an outlet, the recirculation pump outlet in fluidic communication with the filter inlet, and the recirculation pump inlet in fluidic communication with the filter outlet, the recirculation pump configured to recirculate the liquid through the filter.

Another example apparatus for dispensing a liquid onto a substrate may comprise a reservoir for storing the liquid to be dispensed; a filter comprising an inlet and an outlet, the filter inlet in fluidic communication with the reservoir via a first valve; a dosing pump comprising an inlet, a first outlet, and a second outlet, the dosing pump inlet in fluidic communication with the reservoir and the dosing pump second outlet in fluidic communication with the filter inlet via a second valve, the dosing pump configured to dose an amount of the liquid and pump the liquid; and a dispense nozzle in fluidic communication with the dosing pump first outlet, the dispense nozzle configured to dispense the liquid onto the substrate. The dosing pump may be configured to dispense the liquid through the dispense nozzle onto the substrate; and alternately flow the liquid from the dosing pump via the second valve to the filter to filter the liquid while maintaining a positive pressure at the filter inlet and flow the liquid from the reservoir via the filter and trap reservoir to reload the dosing pump while filtering the liquid. The liquid may be alternately flowed from the dosing pump and from the reservoir a plurality of times per dispense.

Another example apparatus for dispensing a liquid onto a substrate may comprise a reservoir for storing the liquid to be dispensed; a dosing pump comprising an inlet and an outlet, the dosing pump inlet in fluidic communication with the reservoir, the dosing pump configured to dose an amount of the liquid and pump the liquid; a dispense nozzle in fluidic communication with the dosing pump outlet, the dispense nozzle configured to dispense the liquid onto the substrate; and a recirculation loop. The recirculation loop may comprise an inlet in fluidic communication with the reservoir; an outlet in fluidic communication with the reservoir; a recirculation pump; and a filter. The recirculation pump and filter may be configured to continuously filter the liquid in the reservoir.

Another example apparatus for dispensing a liquid onto a substrate may comprise a reservoir for storing the liquid to be dispensed; a filter comprising an inlet and an outlet, the filter inlet in fluidic communication with the reservoir; a liquid empty (LE) reservoir comprising an inlet, a first outlet, a second outlet, and a vent port, the LE reservoir inlet in fluidic communication with the filter outlet via a first valve, the vent port comprising a second valve for selectively opening the LE reservoir to a pressure, and the second outlet in fluidic communication with the reservoir via a third valve; a dosing pump comprising an inlet, a first pump outlet, and a second pump outlet, the pump inlet in fluidic communication with the LE reservoir first outlet, and the second pump outlet in fluidic connection with the filter inlet via a fourth valve, the dosing pump configured to dose an amount of the liquid and pump the liquid; and a dispense nozzle in fluidic communication with the first pump outlet, the dispense nozzle configured to dispense the liquid onto the substrate.

An apparatus for supplying a liquid may comprise a main reservoir for storing the liquid; a first liquid empty (LE) reservoir in fluidic communication with the main reservoir; a filter in fluidic communication with the first LE reservoir; a second LE reservoir in fluidic communication with the filter; and a driving system coupled to the first LE reservoir and the second LE reservoir and configured to alternately fill the first LE reservoir and second LE reservoir with the liquid from the main reservoir, wherein the alternate filling of the first LE reservoir and second LE reservoir causes the liquid to be filtered by the filter.

BRIEF DESCRIPTION OF THE DRAWINGS

FIG. 5A is a liquid processing system cycle timing diagram.

DETAILED DESCRIPTION OF SEVERAL EMBODIMENTS

A coating and developing apparatus may be used for coating a wafer with a photoresist liquid and subsequently developing the wafer. Systems and methods described herein may lower photoresist printed wafer defectivity, such as defectivity associated with micro-bridging defects, by providing continuous resist movement (to prevent agglomeration of resist components, etc.) and high filtration number (Fn), where Fn is the effective number of times that the photoresist has been filtered (i.e., pushed or pulled through a filter) on the track.

Figure 1:
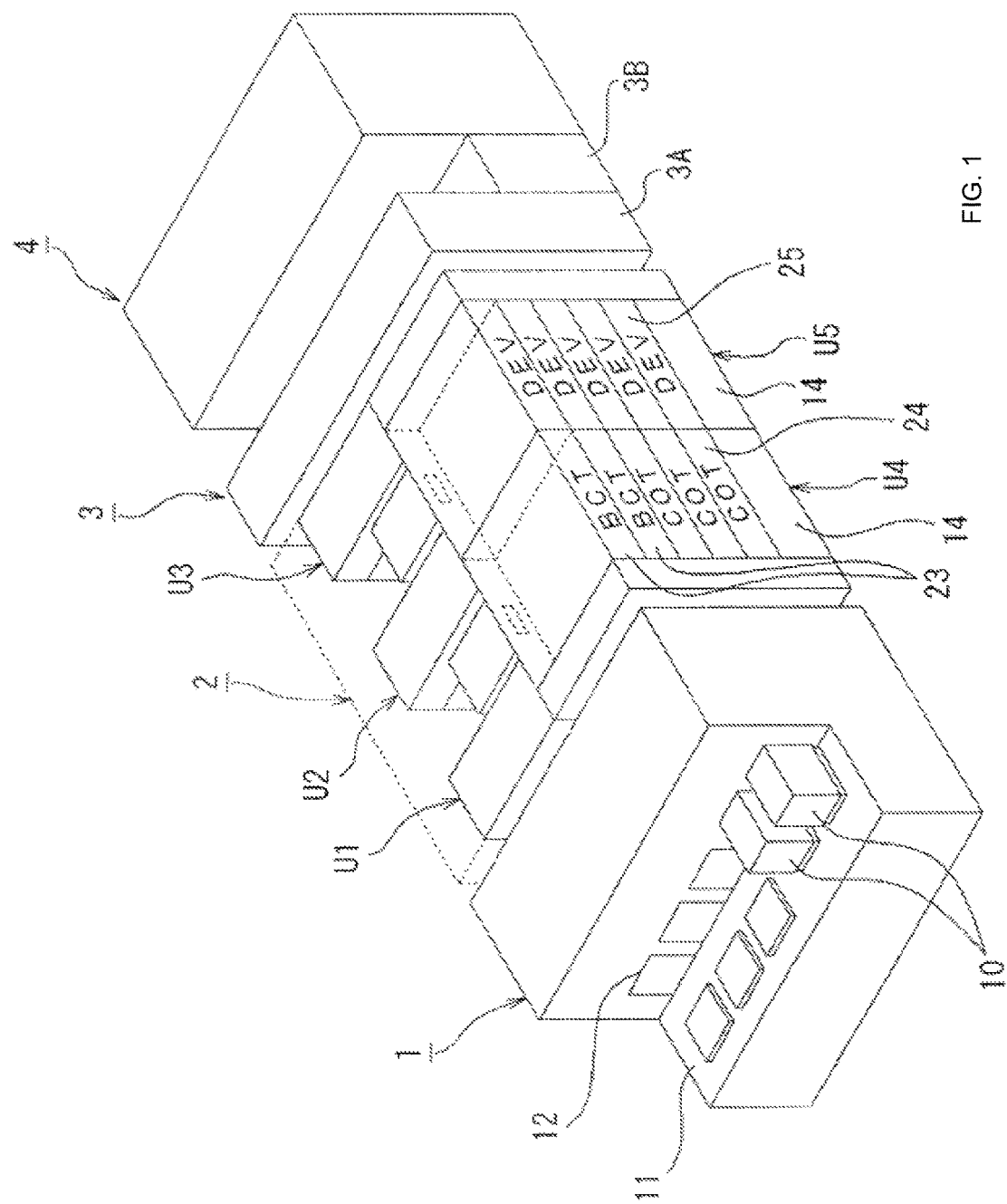
FIG. 1 is a schematic perspective view of a processing system according to an embodiment of the invention.
Figure 2:
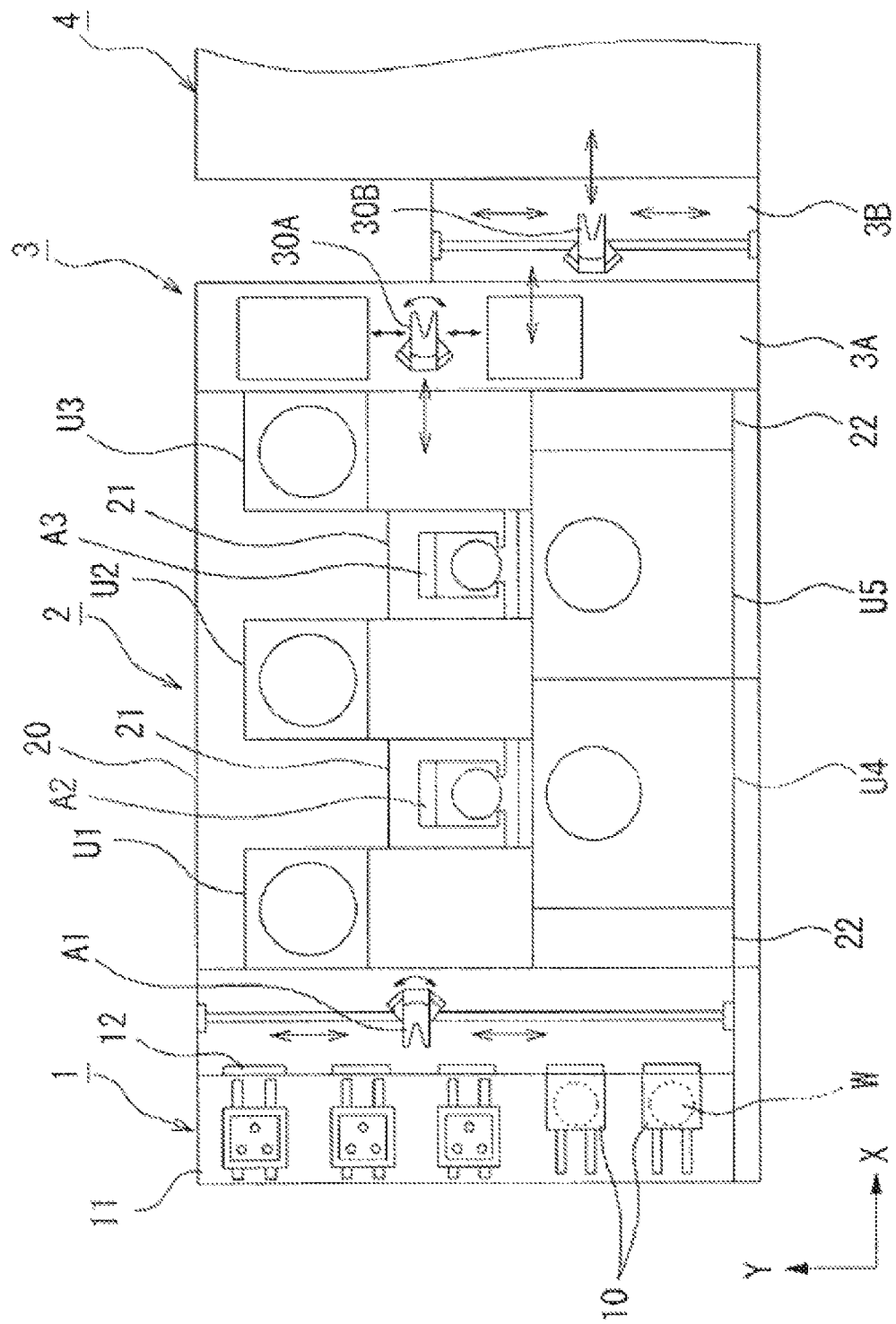
FIG. 2 is a schematic plan view of a processing system according to an embodiment of the invention.

As shown in FIGS. 1 and 2, an example coating and developing apparatus may include a carrier station 1 through which a carrier 10, which may hermetically contain a plurality of (e.g., twenty five) wafers W as substrates to be processed, may be loaded and unloaded; a processing part 2 that may be configured to perform a resist coating process, a developing process, and so on to a wafer W taken out from the carrier station 1; an exposure part 4 that may be configured to expose a surface of the wafer W with a light; and an interface part 3 connected between the processing part 2 and the exposure part 4 that may be configured to deliver and receive a wafer W.

The carrier station 1 may include with stages 11 on which a plurality of carriers 10 may be placed in a line, opening and closing parts 12 formed in a front wall surface seen from the stages 11, and a delivery element A1 that may be configured to take a wafer W out from the carrier 10 through the opening and closing part 12.

The interface part 3 may comprise a first transfer chamber 3A and a second transfer chamber 3B that are located between the processing part 2 and the exposure part 4 in a back and forth direction. The first transfer chamber 3A may include a first wafer transfer part 30A, and the second transfer chamber 3B may include a second wafer transfer part 30B.

The processing part 2 surrounded by a housing 20 may be connected to a rear side of the carrier station 1. In the processing part 2, main transfer elements A2 and A3 may be arranged in order from the front. The main transfer elements A2 and A3 may be configured to deliver and receive a wafer W between shelf units U1, U2, and U3, in which heating and cooling units may be stacked at multiple levels, and liquid processing units U4 and U5. The main transfer elements A2 and A3 may be located in a space surrounded by a partition wall 21 that may comprise a surface part on the side of the shelf units U1, U2, and U3 located in the back and forth direction seen from the carrier station 1; a surface part on the side of the right liquid processing units U4 and U5 described below; and a rear surface part forming a left side surface. Temperature and humidity regulating units 22 may be disposed between the carrier station 1 and the processing part 2, and between the processing part 2 and the interface part 3. Each temperature and humidity regulating unit 22 may include an apparatus for regulating a temperature of a process liquid used by the respective units and a duct for regulating a temperature and a humidity.

The shelf units U1, U2, and U3 may each include various units that may be stacked at multiple levels (e.g., at ten levels). The various units may be configured to perform processes before and/or after a process performed by the liquid processing units U4 and U5. For example, the units may include a synthesis of a heating unit (not shown) for heating (baking) a wafer W and/or a cooling unit (not shown) for cooling a wafer W. As shown in FIG. 1, for example, the liquid processing units U4 and U5 configured to process a wafer W by supplying thereto a predetermined process liquid may be formed by stacking an antireflection film coating unit (BCT) 23 for coating a chemical-liquid container 14 containing a resist and a developing liquid with an antireflection film, a coating unit (COT) 24 for coating a wafer W with a resist liquid, a developing unit (DEV) 25 for developing a wafer W by supplying thereto a developing liquid, and so on, at multiple levels (e.g., at five levels). The coating unit (COT) 24 may include a liquid processing apparatus 5 (or 400, 600, or 800) as described in greater detail below.

An example wafer processing through the coating and developing apparatus as structured above may proceed as follows. First, when the carrier 10 containing the wafers W is placed on the stage 11, the opening and closing part 12 and a lid of the carrier 10 may be opened and a wafer W may be taken out by the delivery element A1. Then, the wafer W may be delivered to the main transfer element A2 through a delivery unit (not shown) that may be one of shelves of the shelf unit U1. The wafer W may be subjected to an antireflection film forming process and a cooling process that may be pre-processes of a coating process. Then, the wafer W may be coated with a resist liquid in the coating unit (COT) 24. Thereafter, the wafer W may be transferred by the main transfer element A2 to the heating unit that may be one of shelves of the shelf units U1 to U3. The wafer W may be heated (baked) in the heating unit. After having been cooled, the wafer W may be loaded into the interface part 3 through the delivery unit of the shelf unit U3. In the interface part 3, the wafer W may be transferred to the exposure part 4 by the wafer transfer part 30A of the first transfer chamber 3A and the wafer transfer part 30B of the second transfer chamber 3B. An exposure element (not shown) may be opposed to the surface of the wafer W, and the wafer W may be exposed. After having been exposed, the wafer W may be transferred to the main transfer element A2 along a reverse route. The wafer W may be developed by the developing unit (DEV) 25 so that a pattern is formed on the wafer W. Thereafter, the wafer W may be returned to the original carrier 10 placed on the stage 11.

The coating and developing apparatus of FIGS. 1 and 2 is provided as an example only, and the systems and methods described below may be applied to the illustrated coating and developing apparatus or a coating and developing apparatus having a different configuration in some embodiments.

Figure 3A:
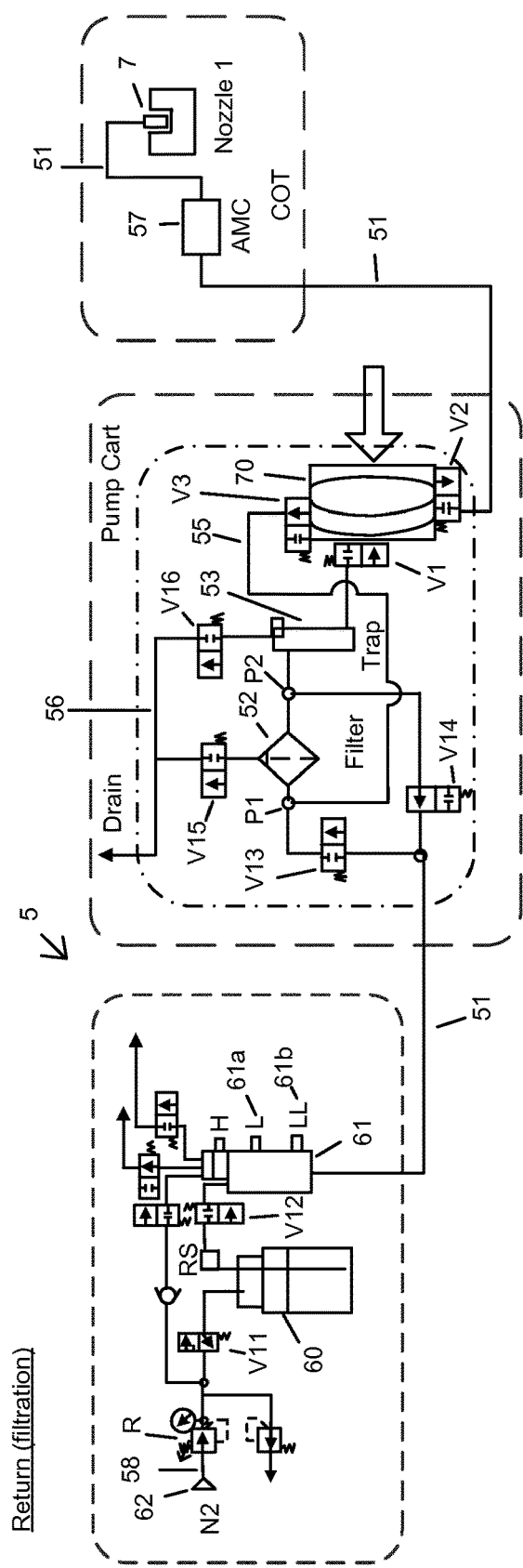
FIGS. 3A-3B are schematic sectional views of a liquid processing apparatus according to an embodiment of the invention.
Figure 3B:
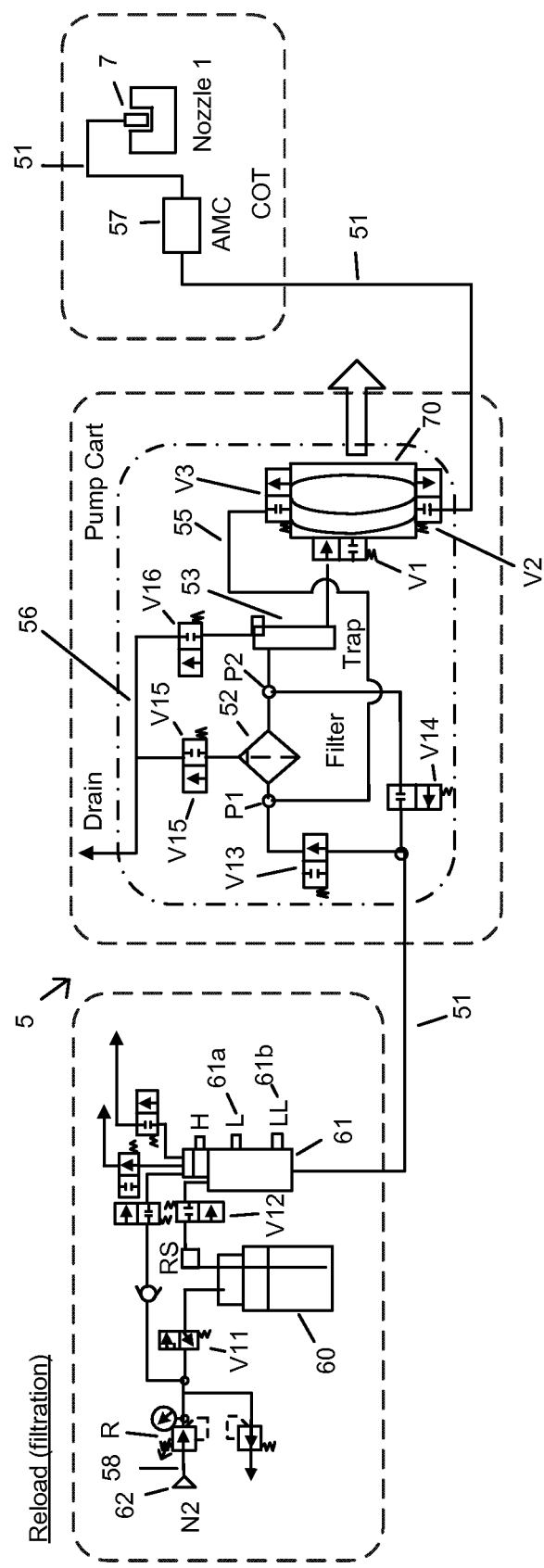

FIGS. 3A-3B show a liquid processing apparatus 5. Similar liquid processing apparatuses are described in detail in U.S. Publication No. 2014/0174475, entitled "Liquid Processing Apparatus, Liquid Processing Method, and Storage Medium for Liquid Process", the entirety of which is incorporated by reference herein.

The example liquid processing apparatus 5 may include a process liquid container 60 that may be configured to contain a resist liquid L as a process liquid; a discharge nozzle 7 that may be configured to discharge (supply) the resist liquid L to a wafer as a substrate to be processed; a supply conduit 51 that may connect the process liquid container 60 and the discharge nozzle 7; a supply control valve 57 that may be disposed in the supply conduit 51 and configured to control supply of the resist liquid L discharged from the discharge nozzle 7; a buffer tank 61 that may be disposed in the supply conduit 51 and configured to temporarily store the resist liquid L guided from the process liquid container 60; a filter 52 that may be disposed in the supply conduit 51 and configured to filter the resist liquid L; a pump 70 that may be disposed in the supply conduit 51 on a secondary side of the filter 52; a trap tank 53 that may be disposed on the supply conduit 51 on a connection portion between the secondary side of the filter 52 and a primary side of the pump 70; a return conduit 55 that may connect a discharge side of the pump 70 and the primary side of the filter 52; a drain conduit 56 connected to the filter 52 and the trap tank 53 through which bubbles generated in the resist liquid L may be discharged; and first to third on-off valves V1 to V3 that may be disposed on a connection portion between the pump 70 and the filter 52, a connection portion between the pump 70 and the discharge nozzle 7, and a connection portion between the pump 70 and the return conduit 55, respectively. The apparatus 5 may be controlled by a control unit (not shown) that may be configured to control the pump 70 and the first, second, and third on-off valves V1 to V3.

A gas supply conduit 58 may be connected to a gas supply source 62 of an inert gas, such as nitrogen ($N_2$) gas, and to an upper portion of the process liquid container 60. The gas supply conduit 58 may include an electro-pneumatic regulator R (e.g., a pressure regulating apparatus capable of varying and regulating a pressure). The electro-pneumatic regulator R may include an operation unit such as a proportional solenoid that may be operated by a control signal from the control unit (not shown), and a valve mechanism that may be opened and closed by the operation of the solenoid. The electro-pneumatic regulator R may be configured to regulate a pressure by opening and closing the valve mechanism. Gas stagnating in an upper portion of the buffer tank 61 may be opened to an atmosphere by a portion of the gas supply conduit 58 connected to the upper portion of the buffer tank 61.

Valves, such as electromagnetic on-off valves V11-V16, may be disposed along the conduits 51, 55, 56, and 58. For example, valve V11 may be disposed between the electro-pneumatic regulator R and the process liquid container 60. Valve V12 may be disposed between the process liquid container 60 and buffer tank 61. Valves V13 and V14 may be disposed between the buffer tank 61 and the filter 52. The drain conduit 56 may be equipped with valves V15 and V16. The valves V11-V16 and the electro-pneumatic regulator R may be controlled by a control signal from the control unit (not shown).

The buffer tank 61 may include an upper-limit liquid level sensor 61a and a lower-limit liquid level sensor 61b that may be configured to monitor predetermined liquid level positions (completely filled position and replenishment requiring position, respectively) of the contained resist liquid L and to detect the remaining amount of the contained resist liquid L. When a liquid level position of the resist liquid L is detected by the upper-limit liquid level sensor 61a while the resist liquid L is supplied from the process liquid container 60 to the buffer tank 61, the on-off valves V11 and V12 may be closed so that the supply of the resist liquid L from the process liquid container 60 to the buffer tank 61 is stopped. On the other hand, when a liquid level position of the resist liquid L is detected by the lower-limit liquid level sensor 61b, the on-off valves V11 and V12 may be opened so that supply of the resist liquid L from the process liquid container 60 to the buffer tank 61 is started.

Detailed operation procedure examples for similar liquid processing apparatuses are given in U.S. Publication No. 2014/0174475. A basic operation of the liquid processing apparatus 5 may be summarized as follows. Gas from the gas supply source 62 may pressurize the process liquid container 60, causing resist liquid L to be supplied into the buffer tank 61. When the buffer tank 61 is sufficiently full, the pump 70 may pump resist liquid L from the buffer tank 61, through the filter 52, through the trap tank 53, and out into the supply control valve 57 which may supply resist liquid L to the discharge nozzle 7 for deposition onto a substrate. Excess resist liquid L may be pumped back out of the supply control valve 57 and nozzle 7 into the buffer tank 61 by the pump 70 after deposition to prevent resist liquid L from drying out inside the nozzle 7 and/or supply control valve 57.

FIGS. 3A and 3B illustrate a process wherein the pump 70 may cycle the resist liquid L through the filter 52 on return (FIG. 3A) and reload (FIG. 3B). On return (after deposition), the pump 70 may push resist liquid L through open valve V3, through filter 52, and through open valve V14 back into the buffer tank 61. Valve V13 may be closed during return to ensure the resist liquid L passes through filter 52. On reload (before deposition), the pump 70 may pull resist liquid L from the buffer tank 61 through open valve V13, through filter 52, and through open valve V1 out to the supply control valve 57 and nozzle 7. Valve V14 may be closed during reload to ensure the resist liquid L passes through filter 52. By performing this operation, the liquid processing apparatus 5 may cycle the resist liquid L through the filter 52 twice for each deposition. As described in greater detail below, the liquid processing apparatus 5 may be controlled by a control unit (e.g., a computer comprising a processor, memory, etc.)

to operate differently, for example to cycle the resist liquid L through the filter 52 more than twice for each deposition.

In the aforementioned liquid processing apparatus 5 example, filtration is linked with the dispense pump. This arrangement may cause filtration to be held to a pump cycle cadence either during production use or during dummy dispense use (wherein fluid is dispensed from the nozzle without a substrate present to keep fluid from stagnating and drying in the nozzle). This arrangement may also dictate that when a filter is exchanged, there may be a certain number of start-up pump cycles required to reach a desired system-wide Fn. As a further result of this arrangement, the high precision dispense pump may need to be able to create high drive pressures to overcome the pressure loss (ΔP) associated with pulling or pushing through a filter membrane.

In the aforementioned liquid processing apparatus 5 example, because some portion of volume in the system may be fed into the filter with Fn=0 (i.e., unfiltered), Fn may have an asymptotic response between 5~10.

Furthermore, the filtration in the aforementioned liquid processing apparatus 5 example may be done by applying both positive (return step) pressure and negative (reload step) pressure to the filtration media. In some liquid processing apparatus 5 embodiments, positive pressure filtration only may be desired (e.g., to provide high filtration quality and/or to avoid large negative pressures wherein the flow capacity through the filter media is not sufficient to keep ΔP below a critical threshold, resulting in a possibility of cavitation or outgassing of the liquid, and thus resulting in a possibility of bubbles forming in the liquid downstream of the filter).

Figure 4A:
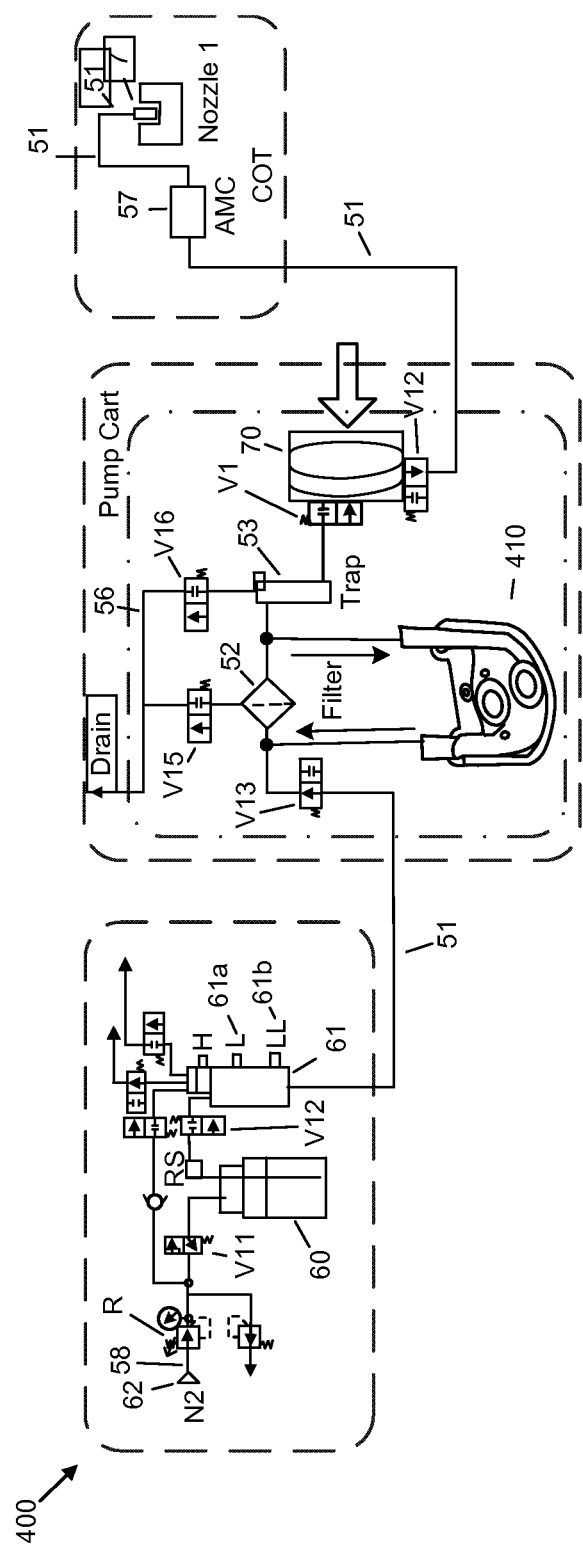
FIGS. 4A-4B are schematic sectional views of a liquid processing apparatus including a recirculating pump according to an embodiment of the invention.
Figure 4B:
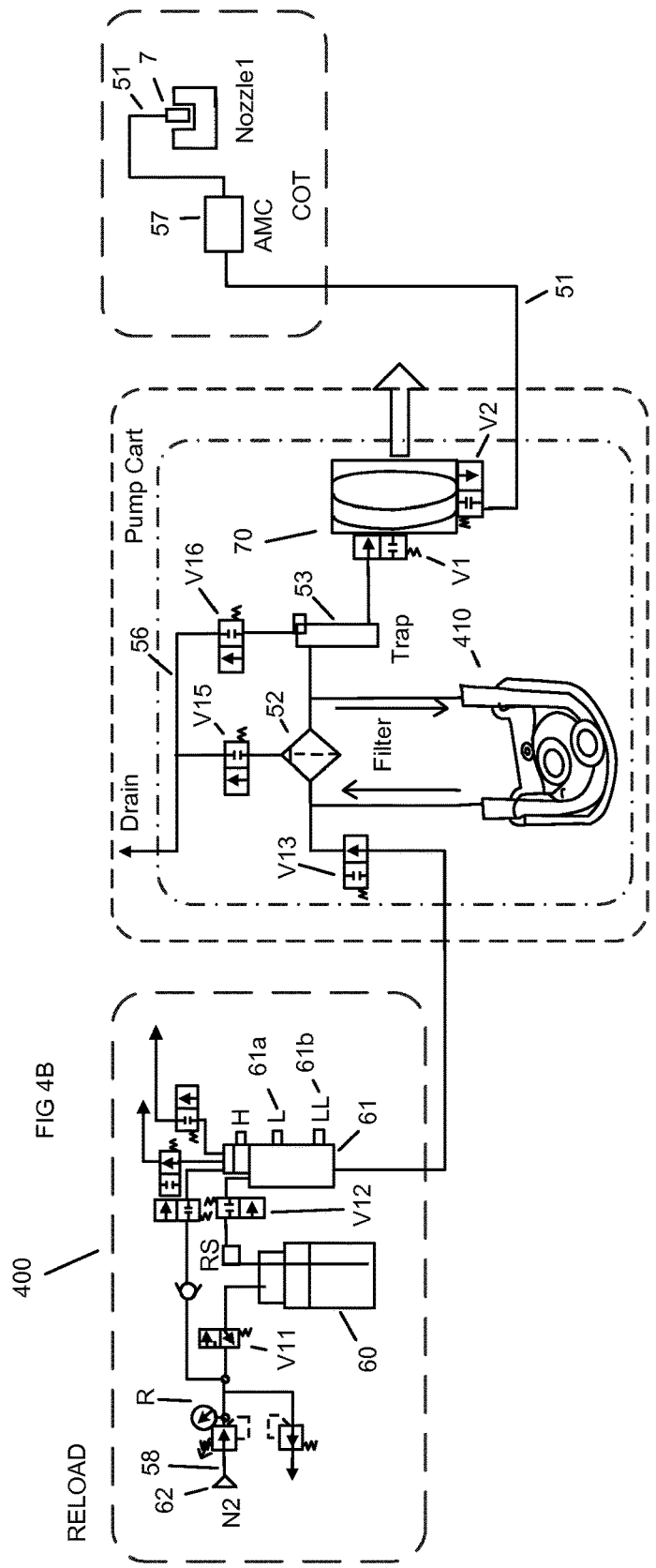

FIGS. 4A-4B show a liquid processing apparatus 400 including a recirculating pump according to an embodiment of the invention. The liquid processing apparatus 400 is similar to the liquid processing apparatus 5 described above with respect to FIG. 3, but also includes a pump 410. For example, pump 410 may be introduced into the photoresist dispense system 5 where the inlet to the pump 410 is taken from the outlet of the filter 52 and the outlet of the pump 410 is fed back into the inlet of the filter 52. The pump 410 may be a peristaltic pump, for example, or some other kind of pump with no moving parts in contact with the fluid (e.g., a pair of diaphragms or a diaphragm and valve). The pump 410 may be operated continuously to provide continuous circulation and filtering of resist material within the system. For dispense pump reload, the pump 410 may remain on or may be temporarily turned off. The liquid processing apparatus 400 may have essentially continuous positive pressure (pushing) filtration. Therefore the liquid processing apparatus 400 may reach a desired Fn significantly faster than a system without the pump 410 and may not be limited to the asymptotic Fn behavior of a system without the pump 410.

Figure 5B:
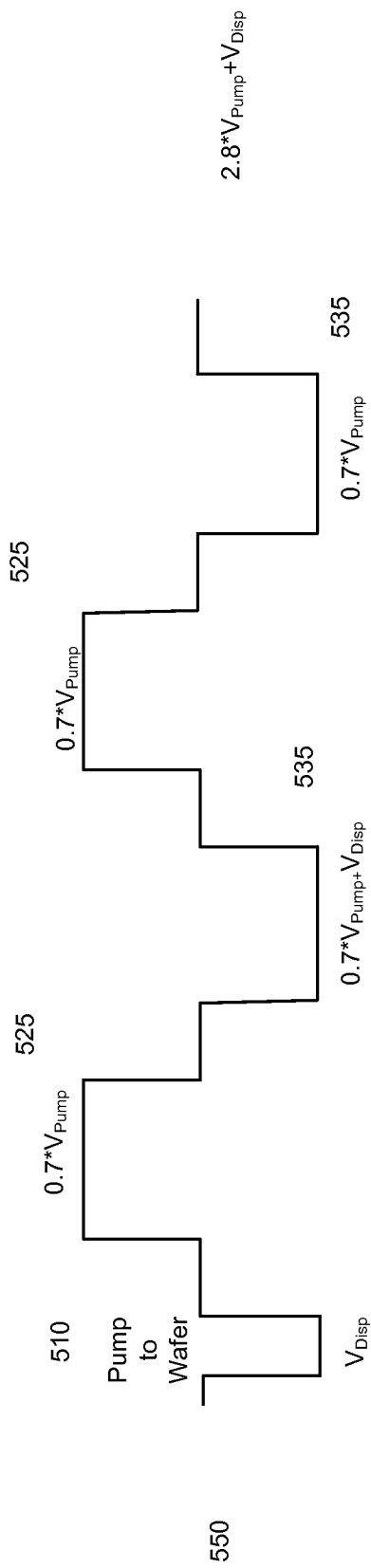
FIG. 5B is a liquid processing system cycle timing diagram according to an embodiment of the invention.

FIGS. 5A-5B are liquid processing system cycle timing diagrams. A liquid processing apparatus 5 may be controlled by a control unit (e.g., a computer comprising a processor, memory, etc.) to operate according to either of the illustrated cycles, for example. FIG. 5A shows a pump cycle 500 having one return step 520 and one reload step 530, similar to the operation described above with respect to FIGS. 3A and 3B. The pump 70 may have a capacity $V_{pump}$. Resist may be pumped to a wafer 510, causing a volume of resist $V_{disp}$ (volume dispensed) to leave the system. The pump 70 may return excess resist not pumped to the wafer, passing a volume of resist $V_{pump}-V_{disp}$ through the filter 52. Next, the pump 70 may reload, in step 530, the resist, and thereby pass a volume of resist $V_{pump}$ through the filter 52 again. The total filtration volume per dispense may therefore be $2*V_{pump}-V_{disp}$.

FIG. 5B shows a pump cycle 550 wherein dead space in the dispense cycle (i.e., down time for the pump 70 and filter 52 while the nozzle 7 deposits resist on a substrate) may be used to cycle fluid through the filter 52. This may break the one return step/one reload step per pump cycle philosophy (both for production or dummy dispense) in an attempt to decrease the time requirement to reach asymptotic Fn for the apparatus 5. During dead time in the pump cycle, additional return/reload steps may be added (e.g., 2 return steps 525 and 2 reload steps 535 per pump cycle 550 within the same pump sequence, although any plural number of steps 525/535 may be possible). This may require a higher filtration rate than the pump cycle 500 of FIG. 5A. To lessen the filtration rate requirements but still push more volume through the filter 52 per pump cycle, a fixed return/reload volume that is a percentage of the overall pump volume may be chosen as described below with respect to FIG. 6 (e.g., a volume may be chosen that is greater than the total pump volume divided by number of return/reload combinations required (>50% of pump volume for 2 return/reload combinations, >33.3% for 3 return/reload combinations, etc.)). This may set the minimum volume requirement for any one combination if all combinations are assumed to be equivalent. Likewise, the apparatus 5 may return/reload the full capacity of the pump 70 in one combination and do only partial pump volume return/reload steps in a second combination, or any combination thereof, to get a similar benefit of increased filtration volume per pump cycle while balancing filtration rate requirements. The example pump cycle 550 of FIG. 5B includes two return steps 525, each filtering a volume of resist $0.7*V_{pump}$, and two reload steps 535, each filtering a volume of resist $0.7*V_{pump}+V_{disp}$. Thus, the total filtration volume for deposit is $2.8*V_{pump}+V_{disp}$.

Figure 6:
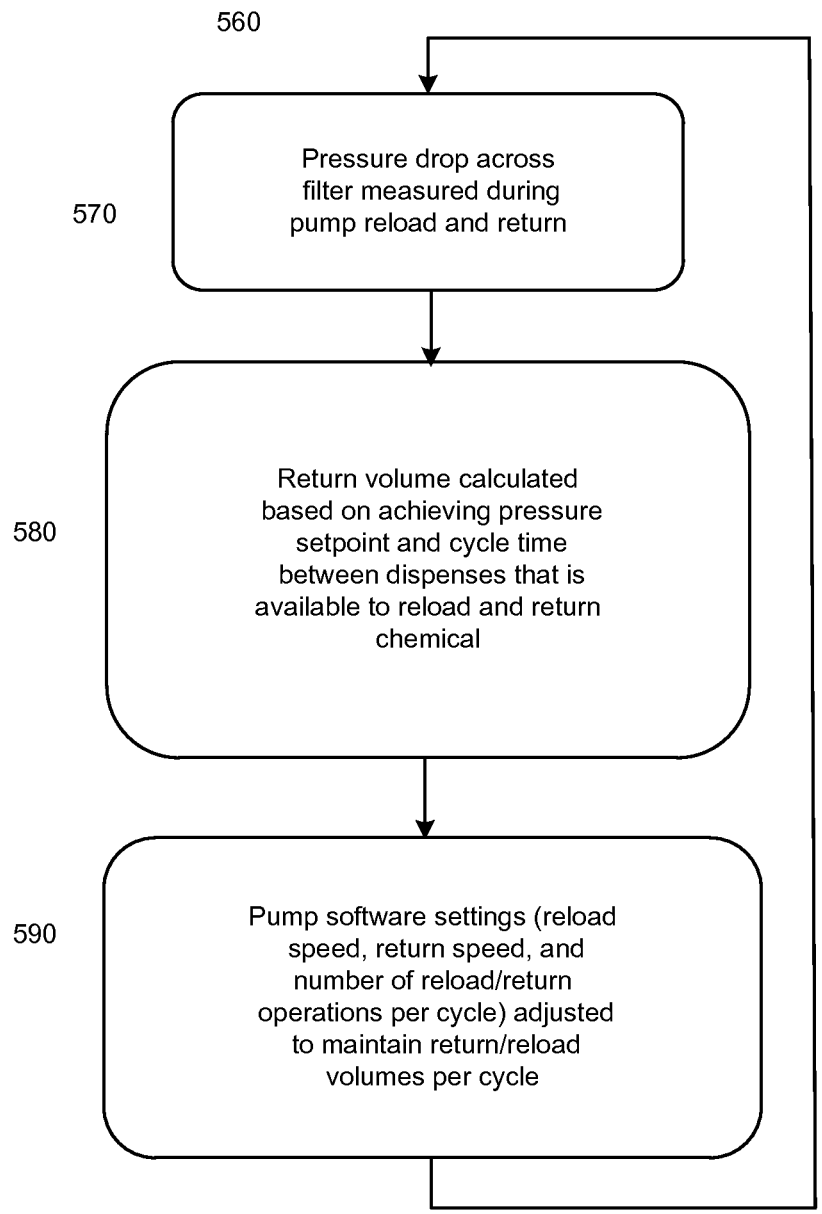
FIG. 6 is a flow chart of a pressure budget maximization process according to an embodiment of the invention.

FIG. 6 shows a pressure budget maximization process 560 according to an embodiment of the invention. In order to choose a fixed return/reload volume that is a percentage of the overall pump volume to optimize operations, pressure drops across the filter 52 may be measured. A pressure drop across the filter 52 may be measured during pump 70 reload and return 570. The pressure drop may be measured by detecting the pressures on both sides of the filter 52. Inlet pressures may be determined using a pressure transducer or other sensor P1 placed in line 51 between the filter 52 and V13, calculated from a pressure gauge on the inert gas supply source 62, or set to 0 when the buffer tank 61 is known to be vented. Outlet pressures may be determined using a pressure transducer or other sensor P2 placed in line 51 between the filter 52 and pump 70, calculated from pump 70 power required for reload and return operations, or calculated from a pressure transducer inside a vacuum or hydraulic line within the pump 70. Return volume may be calculated based on achieving a pressure setpoint and cycle time between dispenses that is available to reload and return the resist 580. Pump 70 settings (e.g., in a memory of the control unit) may be adjusted to maintain a constant return/reload volume per cycle 590. For example, these pump 70 settings may include reload speed, return speed, and/or number of reload/return operations per cycle. This process 560 may be repeated as fluid is passed through the filter.

For example, assuming 90% filtration efficiency, a pressure budget of 200 kPa, a 4:1 return/dispense ratio, a linear relationship between pressure drop across the filter 52 and flow rate, a flow resistance FR defined by (ΔP across filter)/(flow rate)=10 kPa/(cc/min), a cycle time allowed between dispenses CT of 1 minute, a 6 cc maximum pump volume, a 1 cc dispense volume, and a fraction of the cycle that can be used for filtration CF of 0.75, the pressure budget may be maximized according to the following. Volume filtered VF may be equal to return volume+reload volume. Filtration pressure drop FP may be equal to (FR*VF)/(CF*CT). Applying this to the liquid processing apparatus 5 of FIGS. 3A and 3B may indicate that without pressure budget maximization, VF=4+5=9 cc, and FP=9*10/(0.75*1)=120 kPa. Thus, 40% of the 200 kPa pressure budget is unused. The pressure budget may be maximized by setting VF=3.5*4+1=15 cc (e.g., by utilizing the dead space in the cycle to filter the smaller volume 3.5 cc four times). Thus, FP=15*10/(0.75*1)=200 kPa.

FIGS. 7A-7D show a liquid processing apparatus 600 including a pump liquid empty (LE) tank 610 according to an embodiment of the invention. This embodiment may avoid pulling resist through a filter 52 membrane (negative pressure filtration) in a reload operation by changing the trap tank 53 of previously described embodiments to a pump LE tank 610 that can vent to atmosphere, and by adding a valve V60 to close filter media from the pump LE tank 610. This may allow a zero pressure "fast" reload. The zero pressure "fast" reload may be accomplished by reloading with the filter 52 closed off from the pump 70 by the valve V60 and with the pump LE tank 610 vented to atmosphere, thereby allowing for a dispense pump reload at essentially zero pressure, i.e., negligible negative pressure created during reload. This may decrease the time requirement to reach asymptotic Fn for the apparatus 600 (depending on filtration rates chosen) as well as shifting the apparatus 600 to an almost entirely all push, i.e., positive pressure filtration system.

Figure 7A:
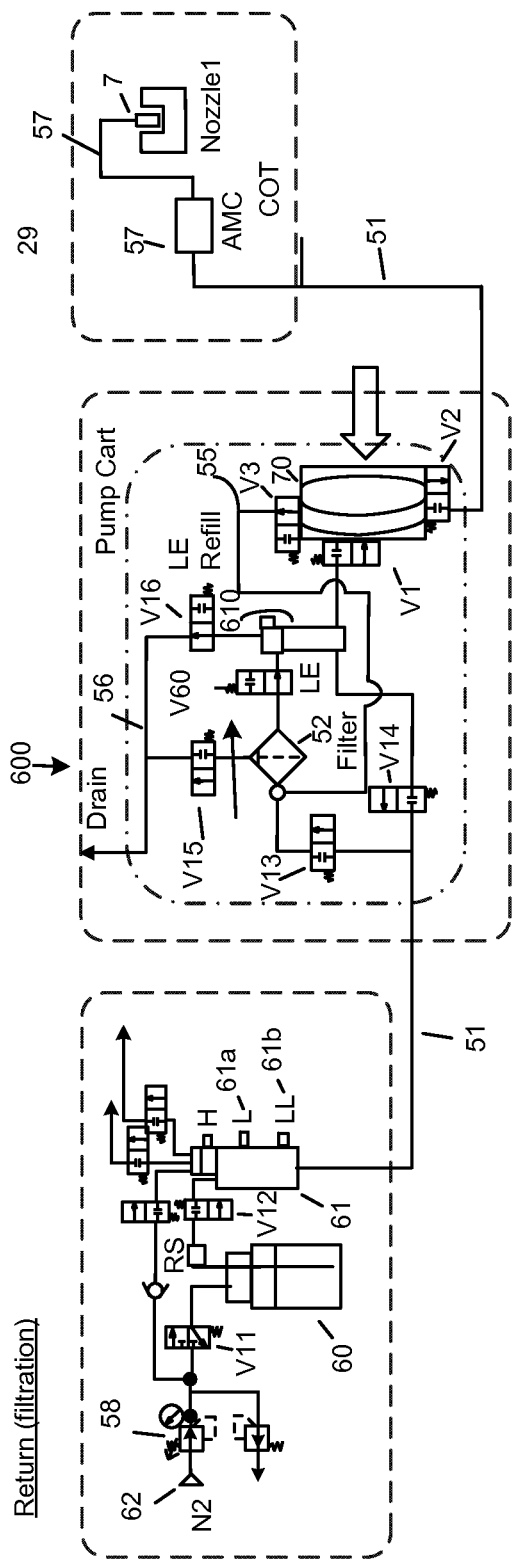
FIGS. 7A-7D are schematic sectional views of a liquid processing apparatus including a pump liquid empty tank according to an embodiment of the invention.
Figure 7B:
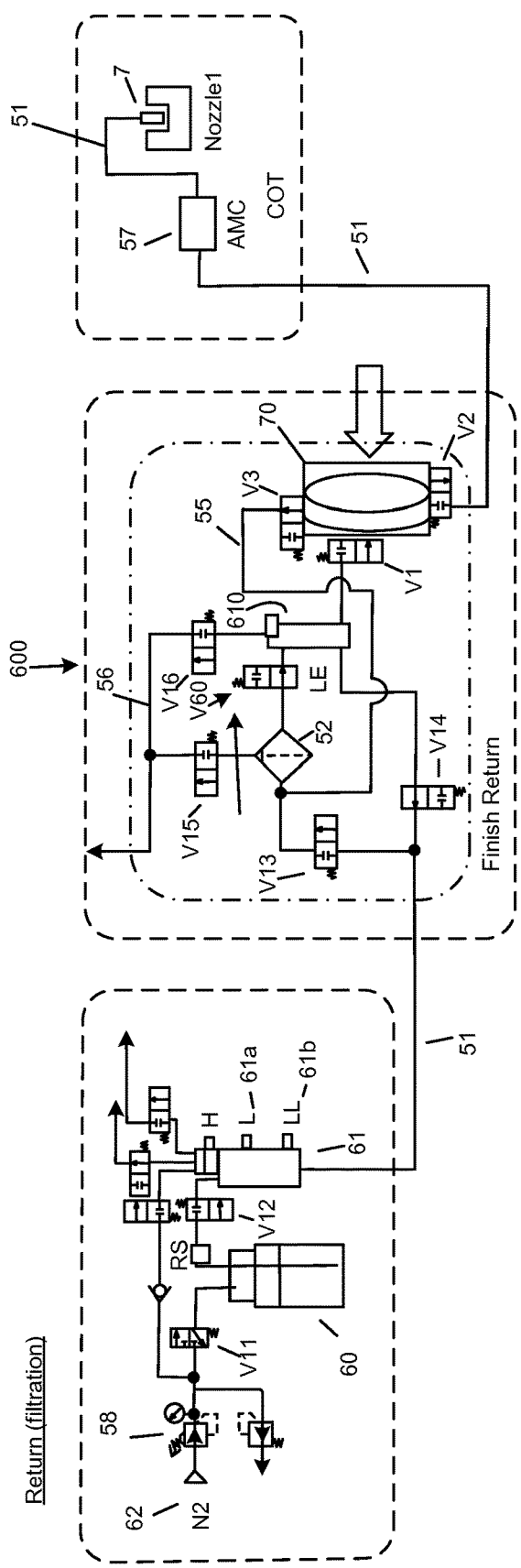
Figure 7C:
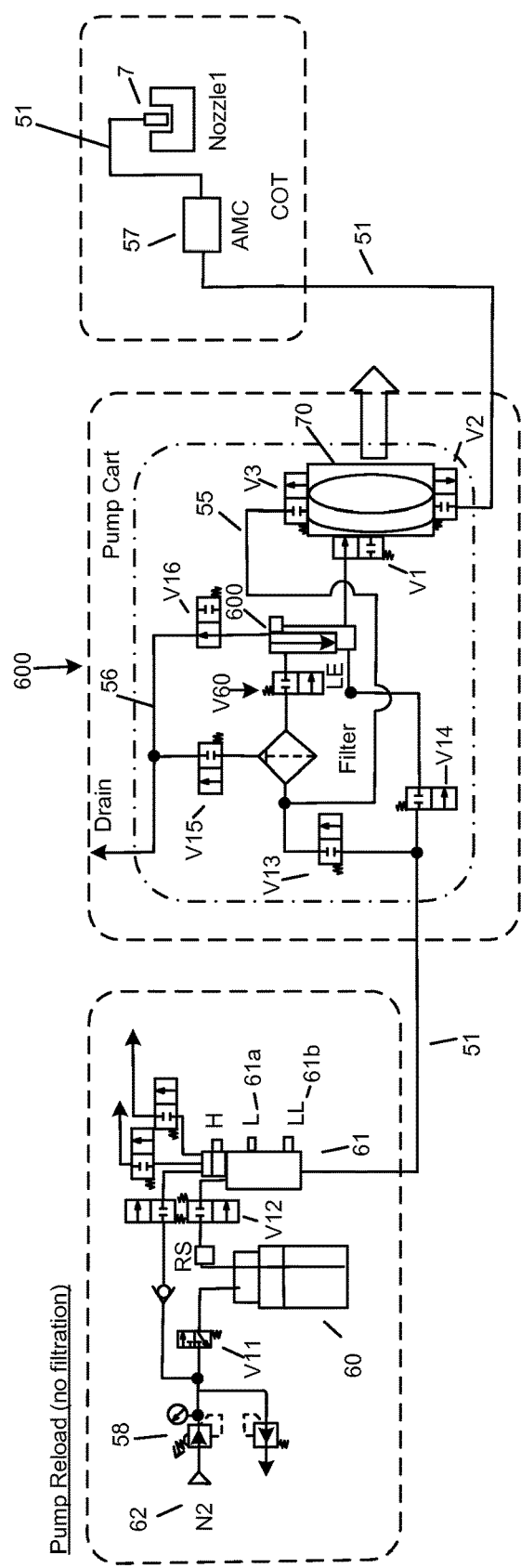
Figure 7D:
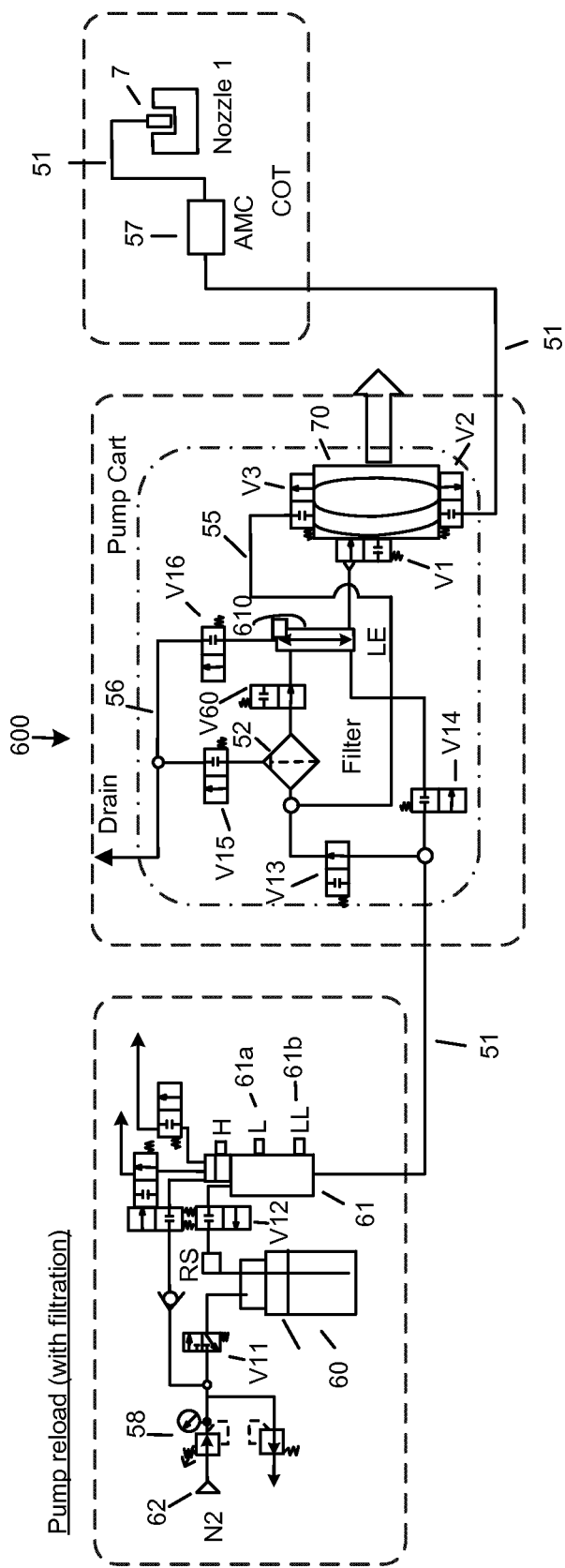
Figure 8:
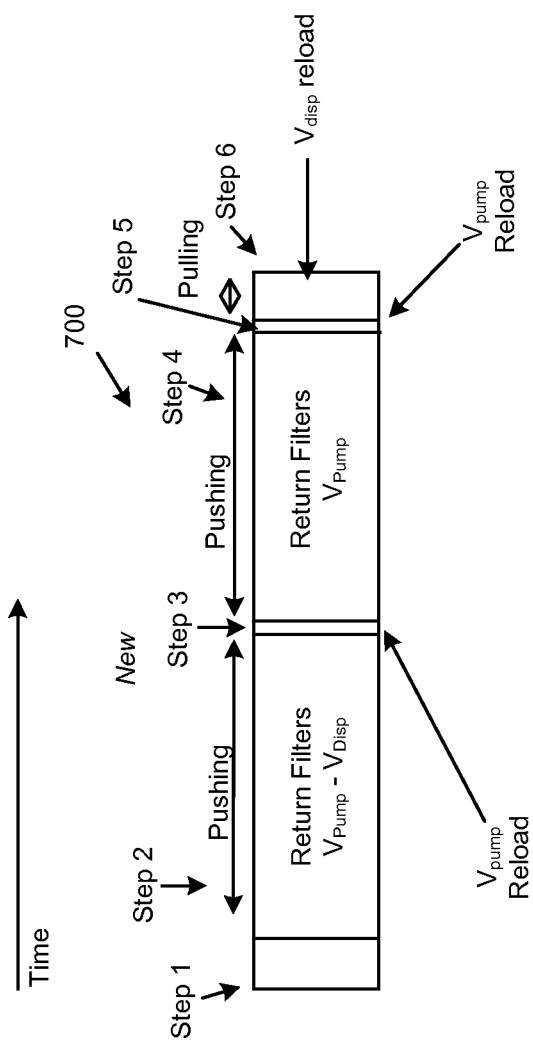
FIG. 8 is a liquid processing system cycle timing diagram according to an embodiment of the invention.

FIG. 8 is a liquid processing system cycle timing diagram 700 according to an embodiment of the invention. In step 1 (a return step), the pump LE tank 610 may be initially refilled by pushing resist through the filter 52 with the pump 70. This is shown in FIG. 7A. Once filled, in step 2, remaining pump 70 contents may be pushed back towards the bottle by pushing them through the filter 52. This is shown in FIG. 7B. In step 3, the pump 70 may be reloaded from the pump LE tank 610 (zero pressure "fast" reload). This is shown in FIG. 7C. In step 4, resist material may be dispensed to a substrate via the nozzle 7. In step 5, a short negative pressure reload step may be performed to compensate for the volume dispensed to the substrate. This is shown in FIG. 7D. Steps 1-3 may be repeated to maintain high Fn. Given that the zero pressure "fast" reload step performs no filtration, in order to get comparable filtration volume per pump cycle as the above-described embodiments, at least 2 recirculation return steps, at least 2 recirculation zero pressure "fast" reload steps, and at least one negative pressure volume dispensed reload step may be performed per pump cycle. Depending on any dead time in the pump cycle, and given that the fast reload may require some time for the dispense pump to fill reliably, achieving additional return/reload cycles (e.g., 2 recirculation return steps, 2 recirculation zero pressure "fast" reload steps, and one negative pressure volume dispense reload step per pump cycle within the same pump sequence) may require a higher filtration rate to be chosen.

Figure 9A:
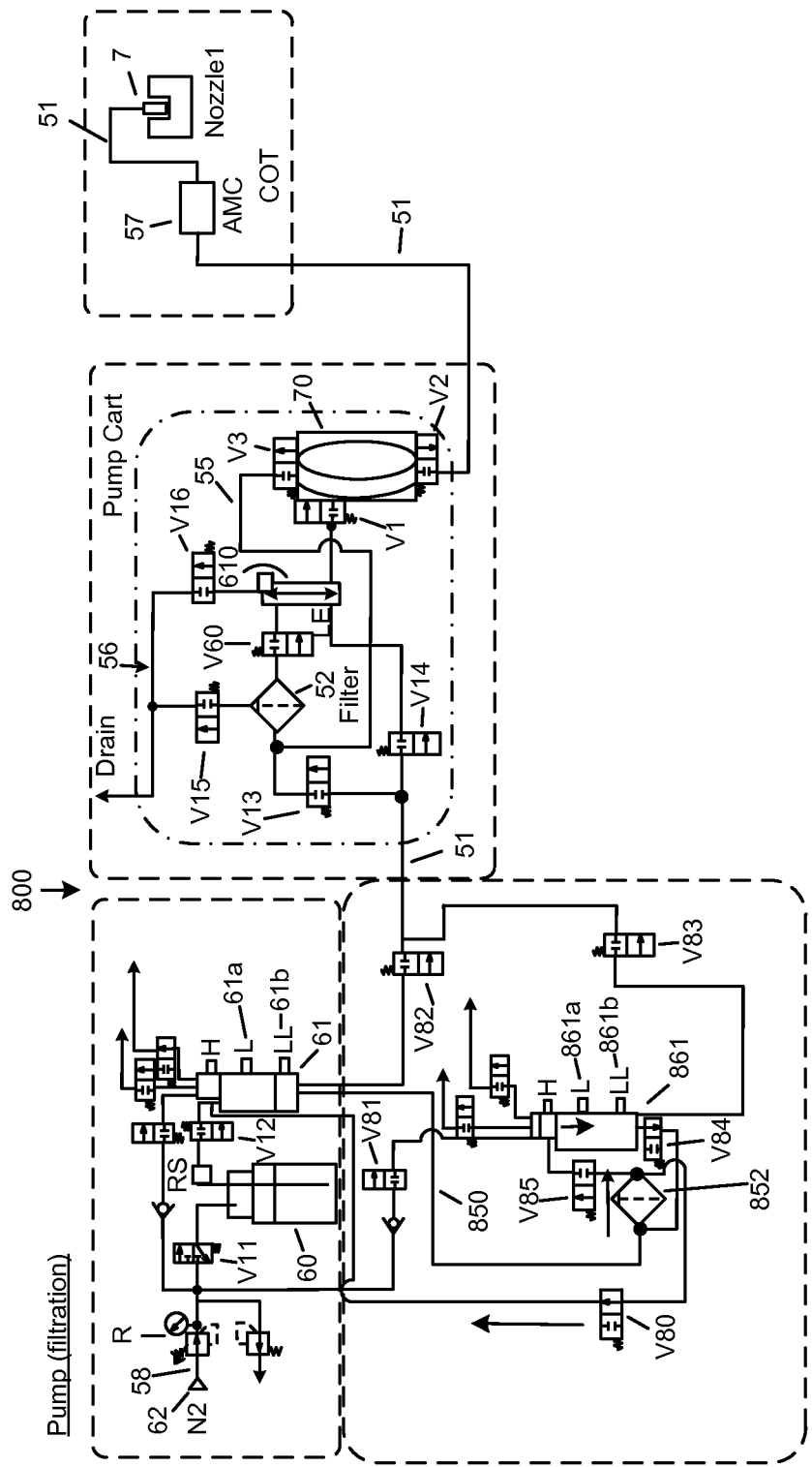
FIGS. 9A-9B are schematic sectional views of a liquid processing apparatus including dual resist tanks according to an embodiment of the invention.
Figure 9B:
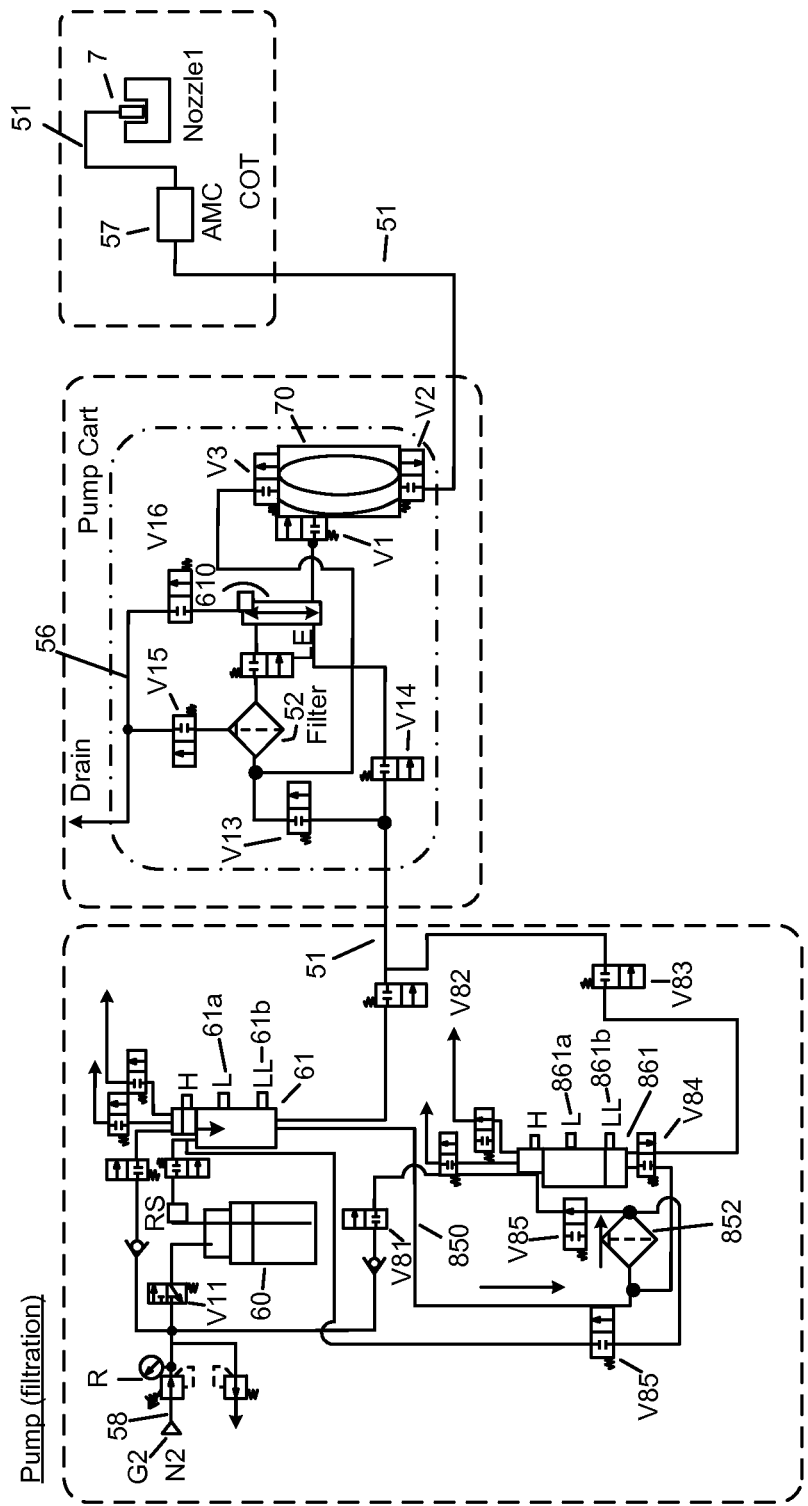

FIGS. 9A-9B show a liquid processing apparatus 800 including dual resist tanks 61 and 861 according to an embodiment of the invention. In this embodiment, a second filtration step may be added to the liquid processing apparatus 800. Specifically, a pre-pump cart filtration step performed by a second filter 852 may significantly increase the Fn achievable by the apparatus 800. To enable this second filtration step, second bottle feed LE tank 861, a second filter 852, and the supporting valves V80-V85 (and control logic and/or software for the control unit) may be added. The tanks 61 and 861 may be coupled to one another via a tank conduit 850. The tanks 61 and 861 may be alternately filled/emptied continuously (e.g., with N2 gas as the fluid driver). The empty LE tank 61, 861 may open its vent to atmosphere and the full LE tank 61, 861 may have N2 supplied to it to push resist from the full LE tank 61, 861 through the added second filter 852 and into the empty LE tank 61, 861. Once the empty LE tank 61, 861 is full, the control unit may switch the necessary valves to allow the now full LE tank 61, 861 to push resist through the second filter 852 and back into the now empty LE tank 61, 861. FIG. 9A shows the apparatus 800 in the state when tank 861 is full, and FIG. 9B shows the apparatus 800 in the state when tank 61 is full. When the pump 70 needs to reload, it may pull from the LE tank 61, 861 that is more full at the time. By continuously cycling fluid through the second filter 852, a much higher Fn may be achieved. This apparatus 800 may have essentially continuous positive pressure (pushing) filtration from the dual LE tank 61, 861 and second filter 852 arrangement, may achieve a high Fn, and may not be limited to asymptotic Fn behavior.

Figure 10:
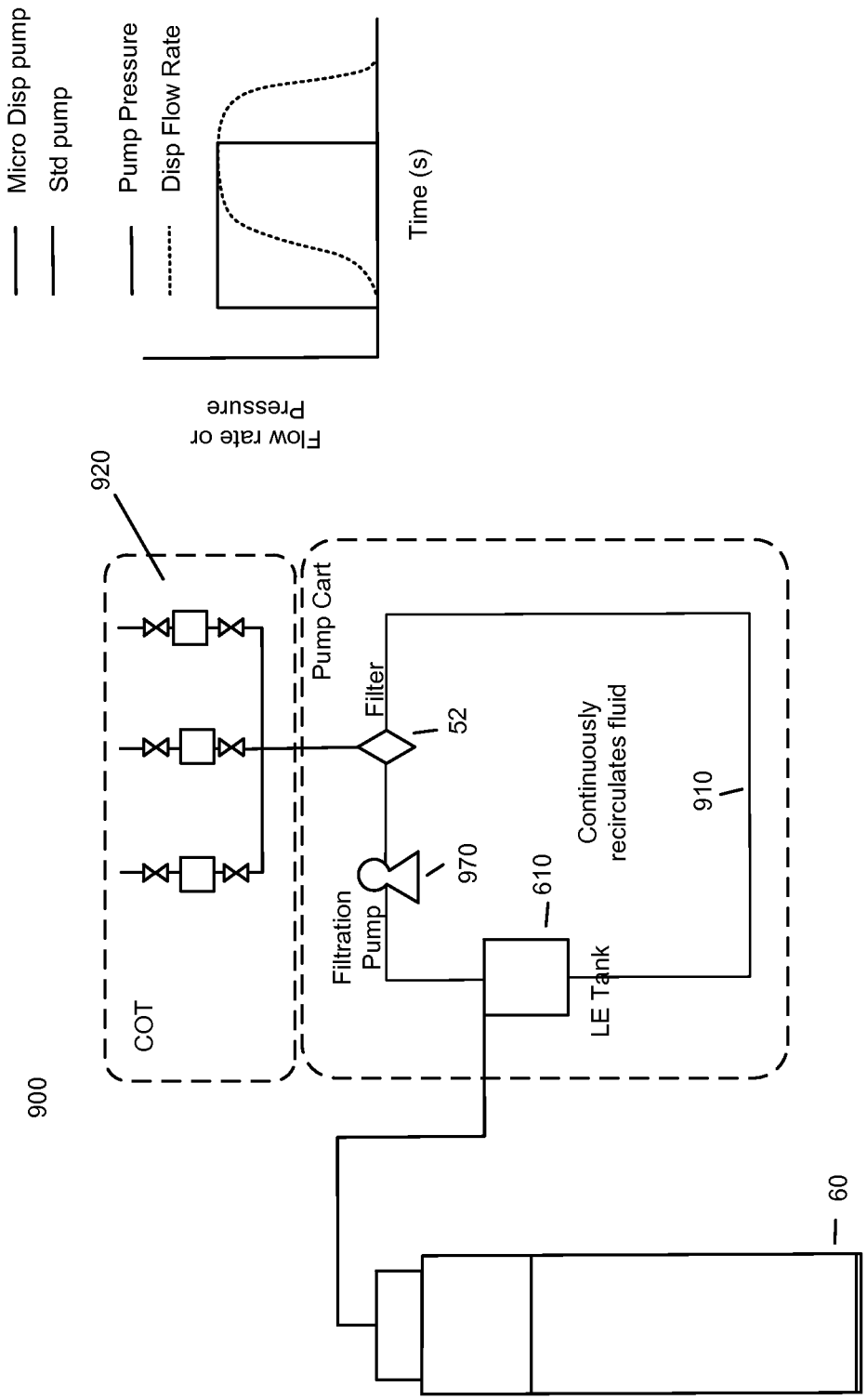
FIG. 10 is a schematic sectional view of a micro dispense pump system according to an embodiment of the invention.

FIG. 10 shows a micro dispense pump system 900 according to an embodiment of the invention. This system 900 may separate the drive pressure requirements to push or pull chemical through a filter from the drive pressure requirements of the actual pump to a dispense point (i.e., the dispense nozzle) by dedicating separate specialized pumps to those two purposes. By eliminating the requirements for high-pressure filtration, the dispense pump 920 may be located much closer to the point of dispense (e.g., nozzle 7), eliminating head-pressure build up and pump stroke/dispense flow delay times and ensuring a more consistent "cup-to-cup" dispense matching as the piping distance between dispense pump 920 and nozzle 7 may always be the same. A high-precision micro-pump 920 located just behind the point of dispense may allow for much lower pressure pump specifications and therefore lead to much better flow rate, and start-and-stop-control. The added flow rate and volume control may also allow for more flexibility for nozzle 7 tip diameter choice (for example, the ability to choose even smaller inner diameter nozzle tips), which may reduce the possibility of coating defects such as a drip at dispense end or dried photoresist clinging to the nozzle 7 tip. The added pump/dispense control may enable variable flow rate dispenses. Resist filtration may be provided by a continuously circulating positive pressure (pushing) filtration loop 910 that makes use of a filtration drive pump 970 (such as a peristaltic pump, for example) driving resist through a filter 52 from a pump LE tank 610 in a continuous loop. This system 900 may reach high Fn due to the continuous circulation, and the continuous circulation may place the entire dispense system under pressure, relieving the micro-pump 920 from pulling negative head pressure during reload (e.g., reload may essentially be a zero effective pressure reload, which may extend pump 920 lifetime).

Figure 11:
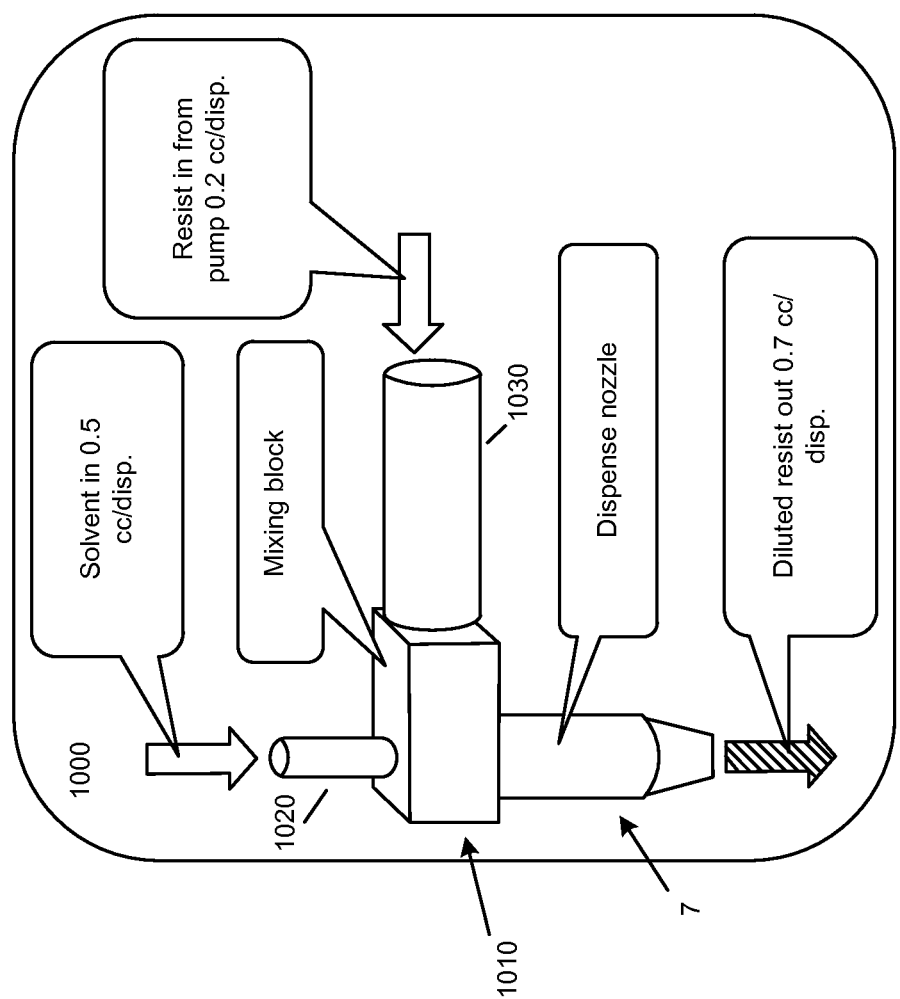
FIG. 11 is a schematic sectional view of a solvent/resist mixing system according to an embodiment of the invention.

FIG. 11 shows a solvent/resist mixing system 1000 according to an embodiment of the invention. This mixing system 1000 may be placed in the supply conduit 51 at the nozzle 7 in any of the above-described embodiments. The mixing system 1000 may provide point of use solvent/resist mixing at the nozzle 7 to allow resist in a single concentration to be used in various applications via dilution with a solvent before application on the substrate. For reference, photoresist may be sold in bottles at specific viscosities tailored to a final thickness range target (e.g., 2.1 cP Polymer A may be applicable for 20-50 nm films), and in many cases the price of the photoresist is not dependent on the viscosity (i.e., concentrated resist costs the same as dilute resist). The mixing system 1000 may provide efficiency and allow a processing apparatus to be readily switched between processing types. The mixing system 1000 may include an inline mixing chamber 1010, a solvent supply system 1020 to the mixing chamber 1010, a photoresist supply system 1030 to the mixing chamber 1010, and a path from the mixing chamber 1010 to the point of dispense (i.e., discharge nozzle 7). The mixing chamber 1010 may be configured such that complete mixing of the solvent and photoresist occur prior to exiting the mixing chamber 1010.

Figure 12:
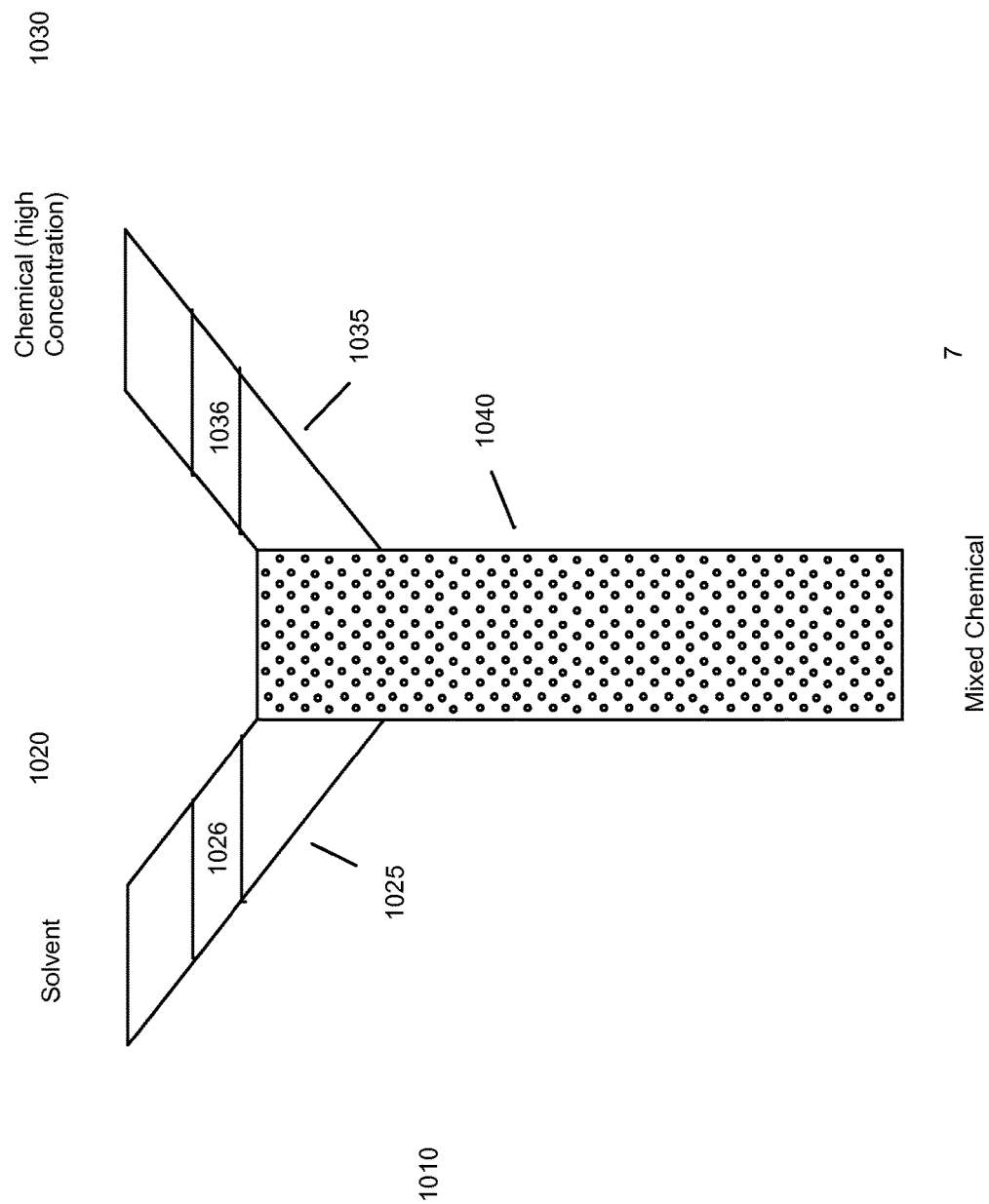
FIG. 12 is a schematic sectional view of a mixing chamber according to an embodiment of the invention.

FIG. 12 shows a mixing chamber 1010 according to an embodiment of the invention. The mixing chamber 1010 may include two inlets, a solvent supply system 1020 inlet 1025 and a photoresist supply system 1030 inlet 1035. Each inlet 1025, 1035 may include an electromechanical flow valve 1026, 1036. Varying the flow of the solvent and resist using these flow valves may determine the ratio of resist to solvent. The flow valves may be controlled by the control unit of the processing apparatus or a separate controller (e.g., a computer comprising a processor, memory, etc.). The mixing chamber 1010 may also include a mixer 1040 that may mix the solvent and resist at the chosen ratio. The mixer 1040 may be a static mixer that mixes the chemicals via flow division or radial mixing, for example. In other embodiments, the mixer 1040 may comprise a holding tank and a stirrer (e.g., a PTFE coated magnetic stirrer). Once mixed, the diluted resist may exit the mixer 1040 and enter the nozzle 7 for deposition on a substrate.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments.

In addition, it should be understood that any figures that highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. An apparatus for dispensing a liquid onto a substrate, comprising:
   a reservoir for storing the liquid to be dispensed;
   a filter comprising an inlet and an outlet, the filter inlet in fluidic communication with the reservoir;
   a liquid empty (LE) reservoir comprising an inlet, a first outlet, a second outlet, and a vent port, the LE reservoir inlet in fluidic communication with the filter outlet via a first valve, the vent port comprising a second valve for selectively opening the LE reservoir to a pressure, and the second outlet in fluidic communication with the reservoir via a third valve;
   a dosing pump comprising an inlet, a first pump outlet, and a second pump outlet, the pump inlet in fluidic communication with the LE reservoir first outlet, and the second pump outlet in fluidic connection with the filter inlet via a fourth valve, the dosing pump configured to dose an amount of the liquid and pump the liquid; and
   a dispense nozzle in fluidic communication with the first pump outlet, the dispense nozzle configured to dispense the liquid onto the substrate;
   wherein the reservoir, the filter, the LE reservoir, the dosing pump, and the dispense nozzle are arranged so that:
     all the liquid that enters the dosing pump through the pump inlet is filtered by the filter before entering the pump inlet;
     the liquid that is pumped through the first pump outlet is fed to the dispense nozzle without passing through the filter after leaving the first pump outlet; and
     the liquid that is returned to the LE reservoir through the second pump outlet passes through the filter before returning to the LE reservoir.

2. The apparatus of claim 1, wherein the pressure is substantially equal to atmospheric pressure.

3. The apparatus of claim 1, further comprising a mixing system disposed between the dosing pump and the dispense nozzle, the mixing system comprising:
   a solvent supply inlet in fluidic communication with a solvent supply;
   a process liquid supply inlet in fluidic communication with the dosing pump outlet;
   a mixing chamber in fluidic communication with the solvent supply inlet and process liquid supply inlet and configured to mix solvent and process liquid; and
   an outlet in fluidic communication with the mixing chamber and the dispense nozzle and configured to supply the mixed solvent and process liquid to the dispense nozzle.

4. The apparatus of claim 3, further comprising:
   a flow valve for the solvent supply inlet; and
   a flow valve for the process liquid supply inlet;
   wherein the flow valves are configured to adjust the ratio of the solvent and the process liquid entering the mixing chamber.

5. The apparatus of claim 3, wherein the mixing chamber comprises a static mixer or a holding tank and a stirrer.

6. The apparatus of claim 1, wherein selectively opening the LE reservoir to the pressure causes liquid from the LE reservoir to flow to the dosing pump and reload the dosing pump.

* * * * *